(12) United States Patent
Takeya et al.

(10) Patent No.: US 12,066,713 B2
(45) Date of Patent: Aug. 20, 2024

(54) DISPLAY APPARATUS

(71) Applicant: Seoul Semiconductor Co., Ltd., Ansan-si (KR)

(72) Inventors: Motonobu Takeya, Ansan-si (KR); Young Hyun Kim, Ansan-si (KR)

(73) Assignee: Seoul Semiconductor Co., Ltd., Ansan-si (KR)

(*) Notice: Subject to any disclaimer, the term of this patent is extended or adjusted under 35 U.S.C. 154(b) by 0 days.

(21) Appl. No.: 18/383,016

(22) Filed: Oct. 23, 2023

(65) Prior Publication Data

US 2024/0053632 A1 Feb. 15, 2024

Related U.S. Application Data

(63) Continuation of application No. 16/935,098, filed on Jul. 21, 2020, now Pat. No. 11,796,857, which is a
(Continued)

(51) Int. Cl.
*G02F 1/13357* (2006.01)
*G02F 1/1335* (2006.01)
(Continued)

(52) U.S. Cl.
CPC .. *G02F 1/133602* (2013.01); *G02F 1/133514* (2013.01); *H01L 25/0753* (2013.01);
(Continued)

(58) Field of Classification Search
CPC ................................................ G02F 1/133602
See application file for complete search history.

(56) References Cited

U.S. PATENT DOCUMENTS

| 5,926,239 A | 7/1999 | Kumar et al. |
| 6,366,018 B1 | 4/2002 | Garbuzov et al. |
| (Continued) | | |

FOREIGN PATENT DOCUMENTS

| CN | 104 952 899 | 9/2015 |
| CN | 105339996 | 2/2016 |
| (Continued) | | |

OTHER PUBLICATIONS

Non-Final Office Action issued Dec. 28, 2018, in U.S. Appl. No. 15/688,425.
(Continued)

*Primary Examiner* — Rafferty D Kelly
(74) *Attorney, Agent, or Firm* — Oblon, McClelland, Maier & Neustadt, L.L.P.

(57) ABSTRACT

A display apparatus device including a panel substrate including a circuit, and a light module including light sources each including a light emitter, a connection line, a light transmission layer on the light emitter, and a light block layer on the light transmission layer, in which the light sources includes first to fourth light sources, a transmission layer of the first light source includes a first converter, a transmission layer of the fourth light source includes a second converter, the first converter includes a wavelength converter to convert a first primary light of the first light source into a red color range, the second converter converts a fourth primary light of the fourth light source into a white light, and a peak wavelength of a second primary light of the second light source is different from that of a third primary light of the third light source.

20 Claims, 9 Drawing Sheets

Related U.S. Application Data continuation of application No. 16/821,251, filed on Mar. 17, 2020, now Pat. No. 10,775,667, which is a continuation of application No. 15/688,425, filed on Aug. 28, 2017, now Pat. No. 10,606,121.

(60) Provisional application No. 62/393,515, filed on Sep. 12, 2016.

(51) Int. Cl.
    *H01L 25/075*      (2006.01)
    *H01L 27/15*      (2006.01)
    *H01L 33/50*      (2010.01)

(52) U.S. Cl.
    CPC ...... *H01L 27/156* (2013.01); *G02F 1/133603* (2013.01); *G02F 1/133612* (2021.01); *G02F 1/133614* (2021.01); *H01L 33/504* (2013.01); *H01L 33/507* (2013.01)

(56) References Cited

U.S. PATENT DOCUMENTS

| | | | |
|---|---|---|---|
| 6,404,125 | B1 | 6/2002 | Garbuzov et al. |
| 6,586,874 | B1 | 7/2003 | Komoto et al. |
| 7,289,089 | B2 | 10/2007 | Iwafuchi |
| 7,323,723 | B2 | 1/2008 | Ohtsuka et al. |
| 7,531,951 | B2 | 5/2009 | Yamanaka |
| 7,683,981 | B2 | 3/2010 | Uemoto |
| 8,791,881 | B2 | 7/2014 | Kanegae et al. |
| 9,111,464 | B2 | 8/2015 | Bibl et al. |
| 10,008,645 | B2 | 6/2018 | Bonar et al. |
| 10,090,367 | B2 | 10/2018 | Choi et al. |
| 10,515,580 | B2 | 12/2019 | Henry et al. |
| 2002/0015013 | A1 | 2/2002 | Ragle |
| 2006/0175621 | A1 | 8/2006 | Ohtsuka et al. |
| 2010/0309101 | A1 | 12/2010 | Kanegae et al. |
| 2013/0126589 | A1 | 5/2013 | Bibl et al. |
| 2014/0014983 | A1 | 1/2014 | Edwards |
| 2014/0091993 | A1 | 4/2014 | Lau et al. |
| 2014/0367633 | A1 | 12/2014 | Bibl et al. |
| 2015/0054008 | A1 | 2/2015 | Rhee |
| 2015/0221619 | A1 | 8/2015 | Rhee |
| 2015/0331285 | A1 | 11/2015 | Bibl et al. |
| 2015/0362165 | A1* | 12/2015 | Chu ............... H01L 33/32 362/235 |
| 2016/0071910 | A1 | 3/2016 | Sasaki et al. |
| 2016/0225343 | A1 | 8/2016 | Ek et al. |
| 2016/0372514 | A1 | 12/2016 | Chang et al. |
| 2018/0158847 | A1 | 6/2018 | Chang et al. |

FOREIGN PATENT DOCUMENTS

| | | |
|---|---|---|
| JP | H10319877 | 12/1998 |
| JP | 2002141492 | 5/2002 |
| JP | 2002217454 | 8/2002 |
| JP | 2003-051616 | 2/2003 |
| JP | 2006120477 | 5/2006 |
| JP | 2007-226246 | 9/2007 |
| JP | 2010-187028 | 8/2010 |
| JP | 2015-500562 | 1/2015 |
| JP | 2016057488 | 4/2016 |
| JP | 2016523450 | 8/2016 |
| KR | 10-2013-0137985 | 12/2013 |
| KR | 10-2016-0010869 | 1/2016 |
| KR | 10-2016-0077617 | 7/2016 |
| WO | 2009133680 | 11/2009 |
| WO | 2016016460 | 2/2016 |
| WO | 2016/079505 | 5/2016 |

OTHER PUBLICATIONS

Final Office Action issued Jun. 21, 2019, in U.S. Appl. No. 15/688,425.
Advisory Action issued Sep. 9, 2019, in U.S. Appl. No. 15/688,425.
Notice of Allowance issued Nov. 20, 2019, in U.S. Appl. No. 15/688,425.
Extended European Search Report mailed Apr. 9, 2020, in European Patent Application No. 17849015.7.
Notice of Allowance dated Jul. 24, 2020 issued to U.S. Appl. No. 16/821,251.
Office Action dated Jan. 7, 2022, in European Patent Office for European Patent Application No. 17849015.7.
Office Action dated Aug. 2, 2022 from the Japanese Patent Office for Japanese Patent Application No. 2021122568 (with English Translation).
Chinese Office Action dated Nov. 14, 2022, in Chinese Patent Application No. 201780069170.7 (with English Translation).
Office Action dated Jun. 29, 2023, issued to Chinese Patent Application No. 201780069170 (with English Concise Explanation).
Non-Final Office Action dated Feb. 3, 2022, in U.S. Appl. No. 16/935,098.
Final Office Action dated Aug. 3, 2022, in U.S. Appl. No. 16/935,098.
Non-Final Office Action dated Nov. 8, 2022, in U.S. Appl. No. 16/935,098.
Notice of Allowance dated May 26, 2023, in U.S. Appl. No. 16/935,098.
Notice of Allowance dated Aug. 28, 2023, in U.S. Appl. No. 16/935,098.

* cited by examiner

DISPLAY APPARATUS

CROSS-REFERENCE TO RELATED APPLICATIONS

This application is a Continuation of U.S. patent application Ser. No. 16/935,098, filed on Jul. 21, 2020, which is a Continuation of U.S. patent application Ser. No. 16/821,251, filed on Mar. 17, 2020, now issued as U.S. Pat. No. 10,775,667, which is a Continuation of U.S. patent application Ser. No. 15/688,425, filed on Aug. 28, 2017, now issued as U.S. Pat. No. 10,606,121 on Mar. 31, 2020, which claims priority from and the benefit of U.S. Provisional Patent Application No. 62/393,515, filed on Sep. 12, 2016, each of which is hereby incorporated by reference for all purposes as if fully set forth herein.

BACKGROUND

Field

Exemplary embodiments of the present disclosure relate to a display apparatus, and more particularly, to a display apparatus using micro-light emitting diodes.

Discussion of the Background

A light emitting diode refers to an inorganic semiconductor device that emits light through recombination of electrons and holes. In recent years, light emitting diodes have been used in various fields including displays, automobile lamps, general lighting, and the like, and application fields of such light emitting diodes have expanded.

Light emitting diodes have various advantages, such as long lifespan, low power consumption, and rapid response. Thus, a light emitting device using a light emitting diode can be used as a light source in various fields.

Recently, smart TVs or monitors realize colors using a thin film transistor liquid crystal display (TFT-LCD) panel, and use light emitting diodes as a light source for a backlight unit for color realization. In addition, a display apparatus is often manufactured using organic light emitting diodes (OLEDs).

As a backlight light source of a TFT-LCD panel, one LED may be used to supply light to many pixels of the TFT-LCD panel. In this structure, since the backlight light source is be kept on regardless of colors displayed on a screen of the TFT-LCD panel, the TFT-LCD panel suffers from constant power consumption regardless of brightness of a displayed screen.

In addition, although power consumption of an OLED display apparatus has been continuously reduced due to technological development, OLEDs still have much higher power consumption than LEDs formed of inorganic semiconductors, and thus, generally have lower efficiency than LEDs.

Moreover, a passive-matrix (PM) drive type OLED display apparatus may suffer from deterioration in response speed from pulse amplitude modulation (PAM) of the OLED having large capacitance. In addition, the PM drive type OLED display apparatus can suffer from deterioration in lifespan from high current driving through pulse width modulation (PWM) for realizing a low duty ratio.

Moreover, an AM driving type OLED display apparatus requires connection of TFTs for each pixel, thereby causing increase in manufacturing costs and non-uniform brightness according to characteristics of TFTs.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments of the present disclosure provide a display apparatus using micro-light emitting diodes having low power consumption to be applicable to a wearable apparatus, a smartphone or a TV.

According to an exemplary embodiment, a display apparatus includes a light emitting part including a plurality of light emitting diodes spaced apart from each other, and a light conversion part configured to convert light emitted from the light emitting part, in which the light emitting diodes include at least one first light emitting diode and at least one second light emitting diode, the light conversion part emits red light through wavelength conversion of light emitted from the at least one first light emitting diode, and the at least one second light emitting diode emits green light.

The at least one first light emitting diode may be a blue light emitting diode or a ultra-violet (UV) light emitting diode, and the light conversion part may include a red phosphor layer emitting red light through wavelength conversion of light emitted from the at least one first light emitting diode.

The at least one first light emitting diode may be disposed in a first subpixel, the at least one second light emitting diode may be disposed in a second subpixel, and the first subpixel may have a size greater than the second subpixel.

The light emitting diodes may further include at least one third light emitting diode disposed in a third subpixel, the first subpixel may have a size greater than the third subpixel, and the first subpixel may be disposed on a first side surface opposing a second side surface on which the second and third subpixels are linearly disposed.

The light emitting diodes may further include at least one third light emitting diode, the at least one second light emitting diode may be a green light emitting diode, and the at least one third light emitting diode may be a blue light emitting diode.

The light emitting diodes may further include at least one third light emitting diode, the at least one third light emitting diode being a UV light emitting diode, and the light conversion part may further include a blue phosphor layer emitting blue light through wavelength conversion of UV light emitted from the UV light emitting diode.

The light emitting diodes may further include at least one fourth light emitting diode, the at least one fourth light emitting diode being a blue light emitting diode, and the light conversion part may further include a white phosphor layer emitting white light through wavelength conversion of light emitted from the fourth light emitting diode.

The first to fourth light emitting diode may be disposed in first to fourth subpixels, respectively, and the first and fourth subpixels may have a size greater than the second and third subpixels.

The first and second subpixels may be disposed in one column, the third and fourth subpixels may be disposed in another column, and the first and fourth subpixels may be disposed in one row.

The light conversion part may include a color filter blocking light of wavelengths other than the red light.

The light emitting part may include a plurality of light emitting diodes, a transparent electrode disposed on the light emitting diodes and electrically connected to the light emitting diodes, a connection electrode disposed under the light emitting diodes and electrically connected to the light emitting diodes, and a blocking portions disposed between the light emitting diodes and electrically connected to the transparent electrodes.

Each of the light emitting diodes may include an n-type semiconductor layer, a p-type semiconductor layer, and an active layer interposed between the n-type semiconductor layer and the p-type semiconductor layer.

The light conversion part may include a phosphor layer including a red phosphor layer emitting red light through wavelength conversion of light emitted from the at least one first light emitting diode, and a protective substrate disposed on the phosphor layer.

The phosphor layer may further include a transparent layer through which light emitted from the second light emitting diode passes without wavelength conversion.

The display apparatus may further include a color filter disposed between the phosphor layer and the protective substrate, and blocking light emitted from the phosphor layer having a first wavelength.

The display apparatus may further include a thin film transistor (TFT) panel part including a plurality of TFTs configured to drive the light emitting diodes, in which the light emitting part and the TFT panel part are coupled to face each other at one side thereof, such that the light emitting diodes are electrically connected to the TFTs, respectively.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
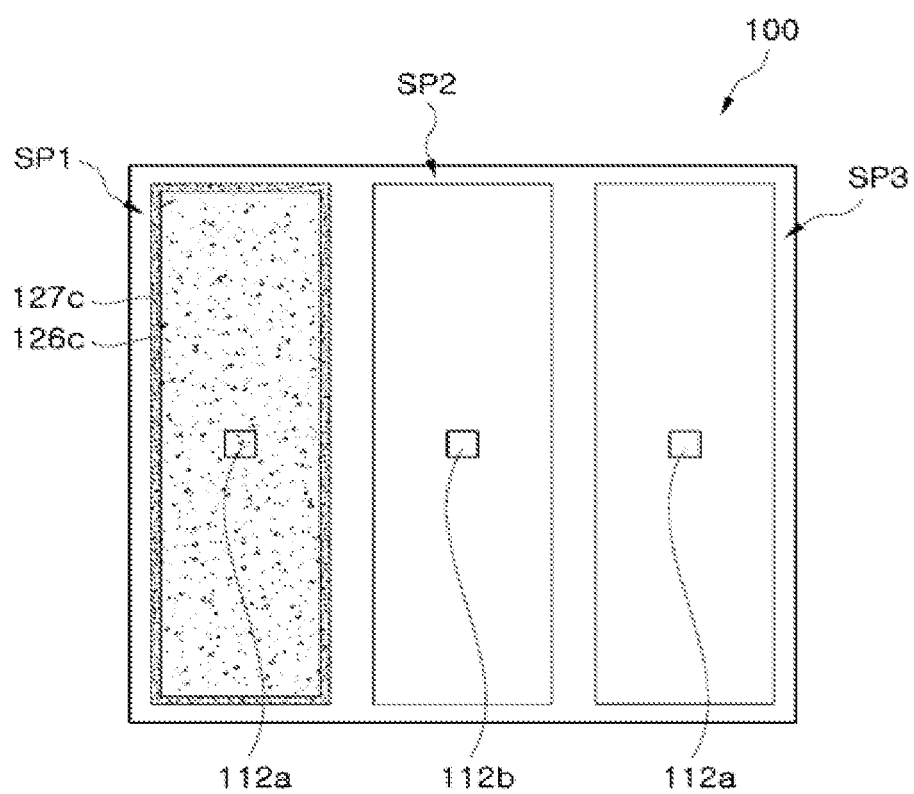
FIG. 1 is a plan view of a pixel of a display apparatus according to a first exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, various exemplary embodiments will be described with reference to the accompanying drawings. The numbering of the exemplary embodiments as first, second, third, etc. is merely for convenience and not a limitation on the number or type of embodiments that may be constructed according to the principles of the invention.

Figure 2:
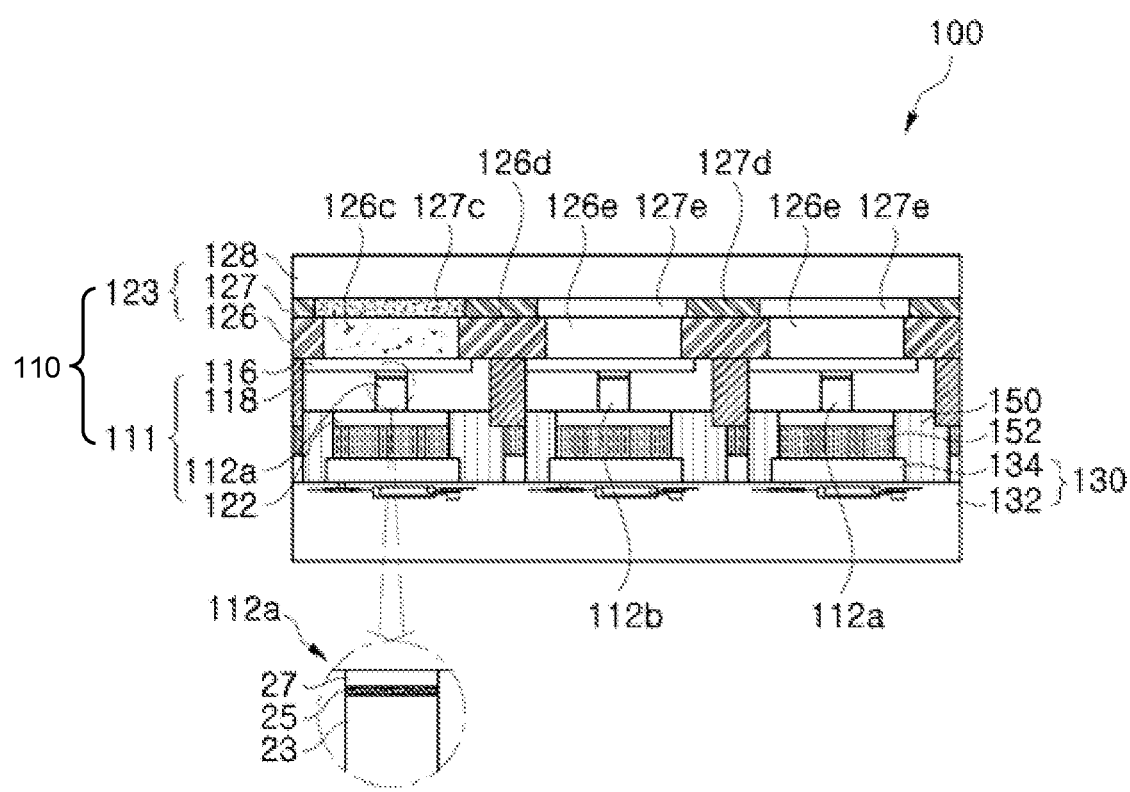
FIG. 2 is a cross-sectional view of the pixel of the display apparatus according to the first exemplary embodiment.

FIG. 1 is a plan view of a pixel of a display apparatus according to a first exemplary embodiment. FIG. 2 is a cross-sectional view of the pixel of the display apparatus according to the first exemplary embodiment.

Referring to FIG. 1 and FIG. 2, the display apparatus 100 according to the first exemplary embodiment includes a light emitting diode part 110, a TFT panel part 130, and an anisotropic conductive film 150. The light emitting diode part 110 includes a light emitting part 111 and a light conversion part 123.

The light emitting part 111 includes blue light emitting diodes 112a, green light emitting diodes 112b, transparent electrodes 116, blocking portions 118, and first connection electrodes 122.

The blue light emitting diode 112a and the green light emitting diode 112b are provided in plural and arranged at regular intervals. For example, a plurality of blue light emitting diodes 112a and a plurality of green light emitting diodes 112b may be arranged at constant intervals in rows and columns. In this manner, a plurality of pixels may be formed.

Referring to FIG. 1, according to the first exemplary embodiment, one pixel may include three subpixels SP1, SP2, and SP3, in which one green light emitting diode 112b is disposed in a second subpixel SP2 and two blue light emitting diodes 112a are disposed in the remaining two subpixels SP1, SP2, respectively. Hereinafter, although the subpixels SP1, SP2, and SP3 will be described as including one of the light emitting diodes 112a and 112b, the inventive concept is not limited thereto, and two or more light emitting diodes may be provided to one subpixel SP1, SP2 or SP3, as needed.

In this exemplary embodiment, each of the subpixels SP1, SP2, and SP3 may have a larger size than the light emitting diode 112a or 112b disposed in the corresponding subpixel SP1, SP2 or SP3. In addition, the subpixels SP1, SP2, SP3 may have the same size from each other.

In the display apparatus 100 according to this exemplary embodiment, when power is applied to each of the light emitting diodes 112a and 112b, each of the light emitting diodes 112a and 112b can be turned on or off by power applied thereto and the light emitting part 111 coupled to the light conversion part 123 may be driven. More particularly, light emitted from the light emitting part 111 is converted into blue light, green light, and red light while passing through the light conversion part 123, whereby blue light, green light, and red light may be discharged from the display apparatus 100. Accordingly, the light emitting diode part 110 of the display apparatus 100 may be driven without a separate LCD.

In this exemplary embodiment, each of the blue light emitting diode 112a and the green light emitting diode 112b may include an n-type semiconductor layer 23, an active layer 25, and a p-type semiconductor layer 27. Here, each of the n-type semiconductor layer 23, the active layer 25, and the p-type semiconductor layer 27 may include Group III-V based compound semiconductors. For example, these semiconductor layers may include nitride semiconductors, such as (Al, Ga, In)N. According to an exemplary embodiment, locations of the n-type semiconductor layer 23 and the p-type semiconductor layer 27 can be interchanged.

The n-type semiconductor layer 23 may be a conductive semiconductor layer including an n-type dopant (for example, Si), and the p-type semiconductor layer 27 may be a conductive semiconductor layer including a p-type dopant (for example, Mg). The active layer 25 is interposed between the n-type semiconductor layer 23 and the p-type semiconductor layer 27, and may have a multi-quantum well (MQW) structure. The composition of the active layer 25 may be determined to emit light having a desired peak wavelength. With this structure, the blue light emitting diode 112a can emit blue light having a peak wavelength of, for example, 430 nm to 470 nm, and the green light emitting diode 112b can emit green light having a peak wavelength of, for example, 510 nm to 550 nm.

In this exemplary embodiment, each of the blue light emitting diode 112a and the green light emitting diode 112b may have the shape of a vertical type light emitting diode. In this structure, an n-type electrode may be formed on an outer surface of the n-type semiconductor layer 23 and a p-type electrode may be formed on an outer surface of the p-type semiconductor layer 27. Hereinafter, descriptions with respect to the n-type electrode and the p-type electrode will be omitted for convenience of description. In an exemplary embodiment, at least one of the n-type electrode and the p-type electrode may be provided in plural.

The transparent electrode 116 may be electrically connected to the n-type semiconductor layer 23 of the blue light emitting diode 112a and the green light emitting diode 112b, and may be electrically connected to the blocking portion 118. The transparent electrode 116 may have as thin a thickness as possible, and may be transparent to allow light emitted from the blue light emitting diode 112a and the green light emitting diode 112b to reach the light conversion part 123 therethrough. For example, the transparent electrode 116 may include indium tin oxide (ITO).

The blocking portions 118 are disposed to define a region for one subpixel, and may include a material exhibiting electrical conductivity. Accordingly, a region for each subpixel may be defined by the blocking portions 118, and each of the blue light emitting diode 112a and the green light emitting diode 112b may be disposed in each of the subpixels SP1, SP2, SP3.

With this arrangement of the blocking portion 118, light emitted from one subpixel may be prevented from reaching other subpixels adjacent thereto. In this exemplary embodiment, a side surface of the blocking portion 118 may be a reflective surface capable of reflecting light emitted from the blue light emitting diode 112a or the green light emitting diode 112b. In addition, although the side surface of the blocking portion 118 is shown as being vertical with respect to the TFT panel part 130, the side surface of the blocking portion 118 may be inclined with respect to the TFT panel part 130. Accordingly, light emitted from each of the light emitting diodes 112a and 112b may be reflected by the blocking portion 118 to be discharged in an upward direction of the subpixel.

The blocking portions 118 may be electrically connected to the TFT panel part 130, such that the TFT panel part 130 may be electrically connected to the n-type semiconductor layer 23 through the transparent electrodes 116 and the blocking portions 118.

The first connection electrodes 122 may be provided in plural, such that one first connection electrode 122 is disposed in each of the subpixels SP1, SP2, and SP3 and electrically connected to the p-type semiconductor layer 27 of the blue light emitting diode 112a and the green light emitting diode 112b. Accordingly, the TFT panel part 130 may be electrically connected to the p-type semiconductor layer 27 through the first connection electrodes 122.

In this exemplary embodiment, the light conversion part 123 includes a phosphor layer 126, a color filter 127, and a protective substrate 128.

The phosphor layer 126 may be disposed on the protective substrate 128, and include a red phosphor layer 126c and a transparent layer 126e. In addition, a blocking layer 126d may be interposed between the red phosphor layer 126c and the transparent layer 126e. The blocking layer 126d may prevent mixture of light by preventing light having entered the red phosphor layer 126c or the transparent layer 126e from entering another red phosphor layer 126c or transparent layer 126e adjacent thereto.

As shown in FIG. 1 and FIG. 2, the red phosphor layer 126c is disposed in a region corresponding to a location, at which one of two blue light emitting diodes 112a is disposed. The transparent layer 126e is disposed in each region where the blue light emitting diode 112a or the green light emitting diode 112b is disposed. That is, the red phosphor layer 126c is disposed in the first subpixel SP1 and the transparent layer 126e is disposed in each of the second and third subpixels SP2, SP3. In this exemplary embodiment, the blocking layer 126d may be disposed between the transparent layers 126e.

In this structure, green light and blue light emitted from the green light emitting diode 112b and the blue light emitting diode 112a disposed in the second and third subpixels SP2 and SP3, on which the transparent layer 126e is disposed, may be discharged through the transparent layer 126e. In addition, light emitted from the blue light emitting diode 112a disposed in the first subpixel SP1 may be converted into red light through wavelength conversion of the red phosphor layer 126c disposed at the location corresponding to the blue light emitting diode 112a, whereby the red light may be discharged to the outside.

Further, in this exemplary embodiment, the color filter 127 may be interposed between the phosphor layer 126 and the protective substrate 128. The color filter 127 may include a red light portion 127c, a light blocking portion 127d, and a transparent portion 127e. In this exemplary embodiment, the color filter 127 may be formed as a film and may block light having passed through the color filter 127, excluding light of a desired wavelength.

More particularly, the red light portion 127c allows only red light to pass therethrough by blocking light having other wavelengths than the red light. In this exemplary embodiment, the red light portion 127c is disposed at a location corresponding to the red phosphor layer 126c, so that light emitted from the red phosphor layer 126c enters the red light portion 127c. Although most blue light emitted from the blue light emitting diode 112a is converted into red light through wavelength conversion of the red phosphor layer 126c, some fractions of the blue right may be discharged to the outside without wavelength conversion. Accordingly, the red light portion 127c may block the blue light not subjected to wavelength conversion while passing through the red phosphor layer 126c.

The transparent portion 127e may be disposed at a location corresponding to the transparent layer 126e of the phosphor layer 126. Accordingly, the transparent portion 127e allows blue light and green light having passed through the transparent layer 126e to be discharged therethrough without wavelength conversion. Further, the light blocking portion 127d is disposed between the red light portion 127c and the transparent portion 127e and may block light having passed though the red light portion 127c and the transparent portion 127e from being discharged to other sides.

The protective substrate 128 is disposed to contact the color filter 127 and may protect the color filter 127 from an external environment, by preventing the color filter 127 from being directly exposed to the outside. In this exemplary embodiment, the protective substrate 128 may be formed of a transparent material to allow light to pass therethrough.

The TFT panel part 130 is coupled to the light emitting part 111 and serves to supply power to the light emitting part 111. The TFT panel part 130 includes a panel substrate 132 and second connection electrodes 134. The TFT panel part 130 may control power supply to the light emitting part 111 to allow only some of the blue light emitting diode 112a and the green light emitting diode 112b in the light emitting part 111 to emit light, and may control the intensity of light emitted from the light emitting diodes 112a and 112b.

The panel substrate 132 may have a TFT drive circuit therein. The TFT drive circuit may be a circuit for driving an active matrix (AM) or a circuit for driving a passive matrix (PM).

The second connection electrodes 134 are electrically connected to the TFT drive circuit of the panel substrate 132 and to the first connection electrodes 122 or the blocking portions 118 of the light emitting part 111. That is, the connection electrodes 134 may be provided in plural and may be separated from each other. Power supplied through the TFT drive circuit may be supplied to the blue light emitting diodes 112a and the green light emitting diodes 112b through the first connection electrodes 122 and the blocking portions 118 via the second connection electrodes 134. The second connection electrodes 134 may be covered by a separate protective substrate, which may include, for example, silicon nitride ($SiN_x$).

The anisotropic conductive film 150 may electrically connect the light emitting part 111 to the TFT panel part 130. The anisotropic conductive film 150 may include an adhesive organic insulating material, which may include conductive particles uniformly dispersed therein to achieve electrical connection. The anisotropic conductive film 150 exhibits electrical conductivity in the thickness direction thereof and insulating properties in the plane direction thereof. In addition, the anisotropic conductive film 150 exhibits adhesive properties. With this structure, the anisotropic conductive film 150 may bond the light emitting part 111 to the TFT panel part 130, such that the light emitting part 111 may be electrically connected to the TFT panel part 130 therethrough. Particularly, the anisotropic conductive film 150 may be advantageously used to connect ITO electrodes, which are generally known as being difficult to solder at high temperature.

As such, when the light emitting part 111 is coupled to the TFT panel part 130 via the anisotropic conductive film 150, each of the first connection electrode 122 and the blocking portion 118 may be electrically connected to the second connection electrode 134 via an electrode connection portion 152.

Figure 3:
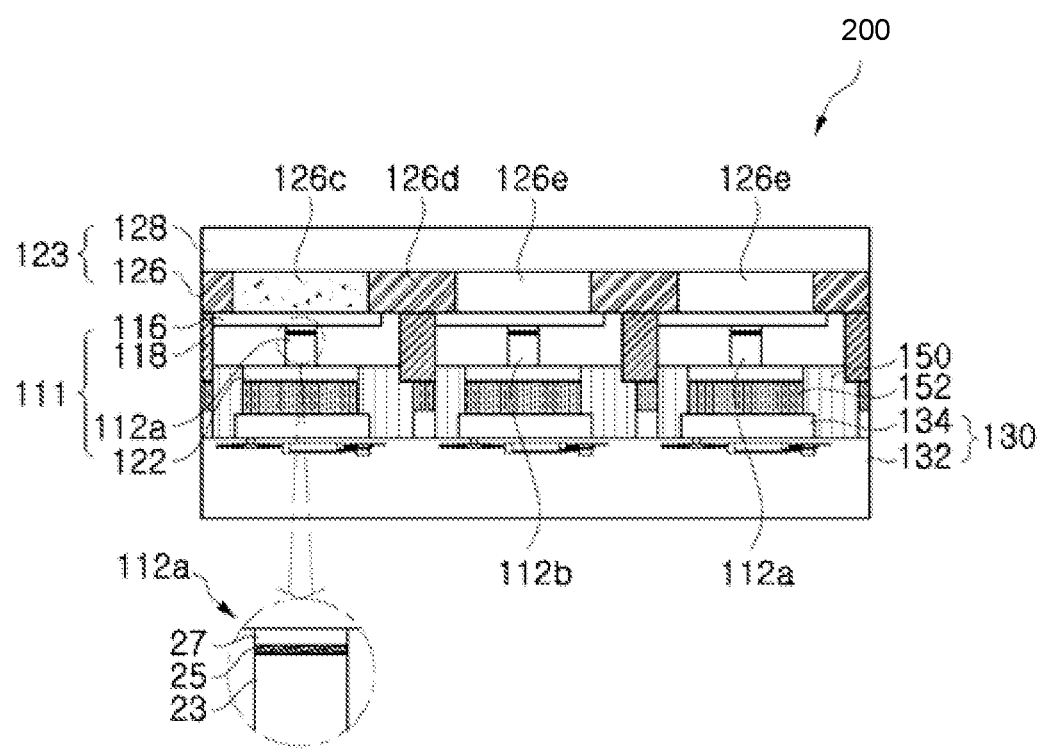
FIG. 3 is a cross-sectional view of a pixel of a display apparatus according to a second exemplary embodiment.

FIG. 3 is a cross-sectional view of a pixel of a display apparatus according to a second exemplary embodiment.

Referring to FIG. 3, the display apparatus 200 according to the second exemplary embodiment includes a light emitting diode part 110, a TFT panel part 130, and an anisotropic conductive film 150. The light emitting diode part 110 includes a light emitting part 111 and a light conversion part 123. The display apparatus 200 according to the second exemplary embodiment may include components substantially similar to those of the display apparatus 100 according to the first exemplary embodiment shown in FIGS. 1 and 2, and thus, repeated descriptions thereof will be omitted.

The light emitting part 111 includes blue light emitting diodes 112a, green light emitting diodes 112b, transparent electrodes 116, blocking portions 118, and first connection electrodes 122. The light conversion part 123 includes a phosphor layer 126 and a protective substrate 128.

Unlike the first exemplary embodiment, the light conversion part 123 of the display apparatus 200 according to this exemplary embodiment does not include the color filter 127 (see FIG. 2). Accordingly, blue light emitted from one of two blue light emitting diodes 112a in the light emitting part 111 is converted into red light by wavelength conversion while passing through a red phosphor layer 126c of the phosphor layer 126, whereby the red light may be discharged to the outside through the protective substrate 128. More particularly, in this exemplary embodiment, the phosphor layer 126 includes the red phosphor layer 126c and a transparent layer 126e. As such, when the light conversion part 123 includes the phosphor layer and the protective substrate 128, the light conversion part 123 may be formed to have a smaller thickness than in the first exemplary embodiment.

Although the light emitting part 111 includes the blue light emitting diodes 112a and the green light emitting diodes 112b in the first and second exemplary embodiments, the light emitting part 111 may further include a UV light emitting diode 112d, as needed. The UV light emitting diode 112d may be disposed in the first subpixel SP1, in which the red phosphor layer 126c of the phosphor layer 126 is disposed, and replace the blue light emitting diode 112a of the first and second exemplary embodiments. Accordingly, UV light emitted from the UV light emitting diode 112d is converted into red light through wavelength conversion of the red phosphor layer 126c, whereby the red light may be discharged to the outside. The UV light emitting diode 112d may emit UV light having a peak wavelength of, for example, 360 nm to 430 nm.

As in the first exemplary embodiment, the second and third subpixels SP2 and SP3 include the green light emitting diode 112b and the blue light emitting diode 112a, respectively.

Figure 4:
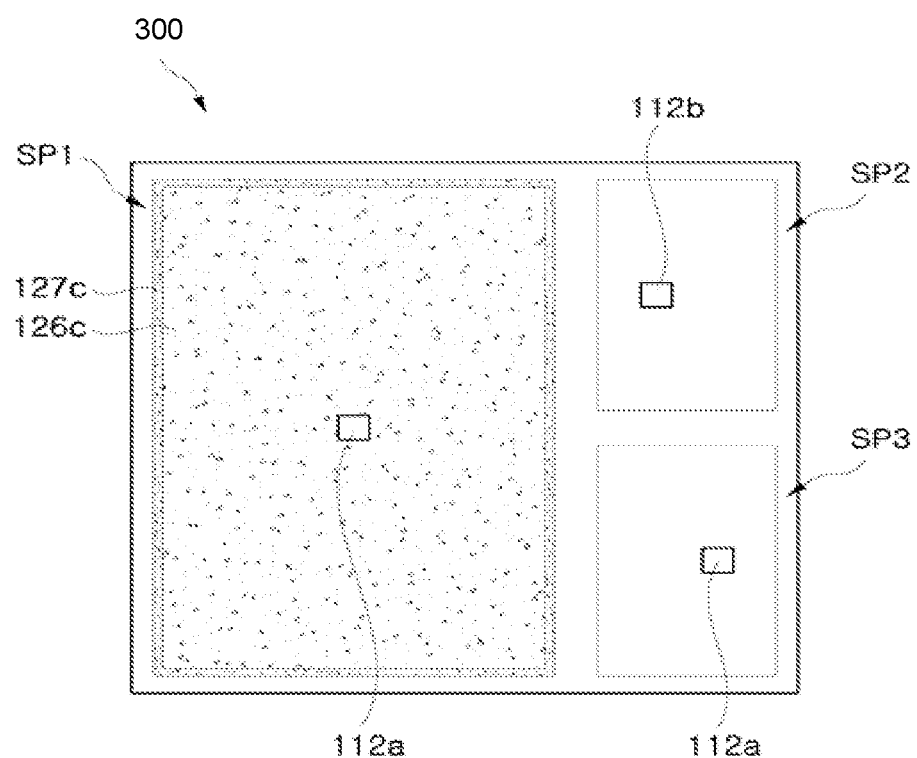
FIG. 4 is a plan view of a pixel of a display apparatus according to a third exemplary embodiment.
Figure 5:
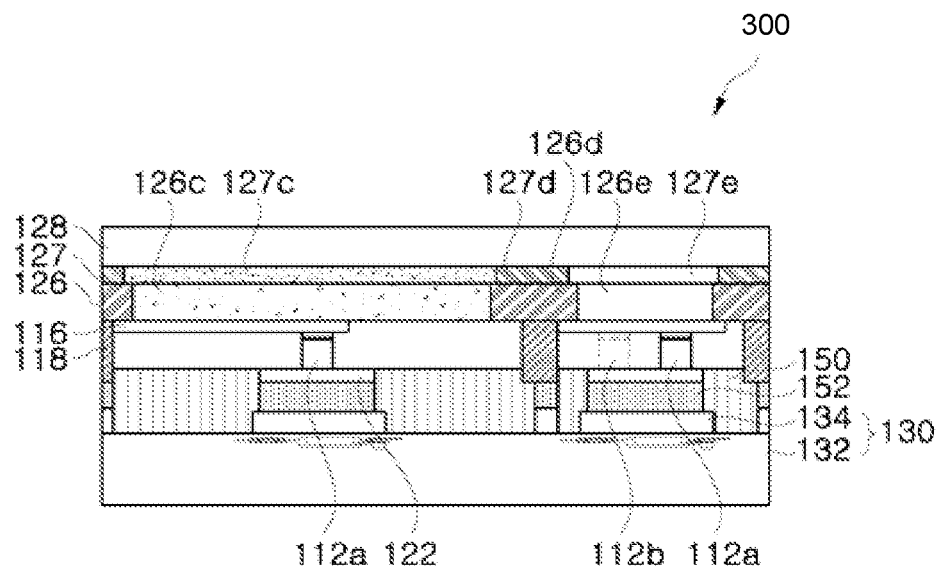
FIG. 5 is a cross-sectional view of the pixel of the display apparatus according to the third exemplary embodiment.

FIG. 4 is a plan view of a pixel of a display apparatus according to a third exemplary embodiment. FIG. 5 is a cross-sectional view of the pixel of the display apparatus according to the third exemplary embodiment.

Referring to FIG. 4 and FIG. 5, the display apparatus 300 according to the third exemplary embodiment includes a light emitting diode part 110, a TFT panel part 130, and an anisotropic conductive film 150. The light emitting diode part 110 includes a light emitting part 111 and a light conversion part 123. The display apparatus 300 according to the third exemplary embodiment may include components substantially similar to those of the display apparatus 100 according to the first exemplary embodiment shown in FIGS. 1 and 2, and thus, repeated description thereof will be omitted.

The light emitting part 111 includes blue light emitting diodes 112a, green light emitting diodes 112b, transparent electrodes 116, blocking portions 118, and first connection electrodes 122. The light conversion part 123 includes a phosphor layer 126, a color filter 127, and a protective substrate 128.

Referring to FIG. 4, in this exemplary embodiment, one pixel includes three subpixels SP1, SP2, and SP3, in which two blue light emitting diodes 112a and one green light emitting diode 112b are disposed in the three subpixels SP1, SP2, and SP3, respectively. Among the three subpixels SP1, SP2, and SP3, a first subpixel SP1 has a larger size than second and third subpixels SP2 and SP3. The second and third subpixels SP2, SP3 may have the same area from each other. Although FIG. 4 shows that the first subpixel SP1 has an area about four times greater that of the second or third subpixel SP2 and SP3, the inventive concept is not limited thereto, and the size of the subpixels may be modified in various ways.

In this exemplary embodiment, the blue light emitting diodes 112a are disposed in the first and third subpixels SP1 and SP3, respectively, and the green light emitting diode 112b is disposed in the second subpixel SP2.

As in the first exemplary embodiment, the light conversion part 123 includes a phosphor layer 126, a color filter 127, and a protective substrate 128. The phosphor layer 126 includes a red phosphor layer 126c, a blocking layer 126d, and a transparent layer 126e. The color filter 127 includes a red light portion 127c, a blocking portion 118, and a transparent portion 127e. In this exemplary embodiment, the red phosphor layer 126c is disposed in the first subpixel SP1 and the transparent layer 126e is disposed in the second and third subpixels SP2, SP3. Each of the red phosphor layer 126c and the transparent layer 126e may have a size corresponding to the size of the corresponding subpixel. Thus, the red phosphor layer 126c may have a larger size than the transparent layer 126e.

In the color filter 127, the red light portion 127c is disposed in the first subpixel SP1 and the transparent portion 127e is disposed in each of the second and third subpixels SP2 and SP3. Each of the red light portion 127c and the transparent portion 127e may have a size corresponding to the size of the subpixel, in which the red light portion 127c or the transparent portion 127e is disposed. Thus, the red light portion 127c may have a larger size than the transparent portion 127e.

As described above, because the first subpixel SP1 has a larger size than the second and third subpixels SP2 and SP3, the red phosphor layer 126c and the red light portion 127c may be disposed only in the first subpixel SP1.

The second and third subpixels SP2 and SP3 allow green light and blue light emitted from the green light emitting diode 112b and the blue light emitting diode 112a to be discharged to the outside without wavelength conversion, respectively. On the other hand, in the first subpixel SP1, blue light emitted from the blue light emitting diode 112a is converted into red light through wavelength conversion of the red phosphor layer 126c, whereby the red light may be discharged to the outside. Here, the intensity of light emitted from the blue light emitting diode 112a may be reduced when discharged to the outside after passing through the red phosphor layer 126c and the red light portion 127c.

According to this exemplary embodiment, since the first subpixel SP1, in which the red phosphor layer 126c and the red light portion 127c are disposed, has a larger size than the second and third subpixels SP2 and SP3, light emitted from the subpixels SP1, SP2, and SP3 may have the same intensity. Thus, the sizes of the first to third subpixels SP1, SP2, and SP3 may be changed such that light emitted from the subpixels SP1, SP2, and SP3 can have the same intensity.

According to this exemplary embodiment, the light emitting part 111, the light conversion part 123, and the TFT panel part 130 have the same structures as those of the first exemplary embodiment, and are different in size and location from those of the first exemplary embodiment in plan view.

Figure 6:
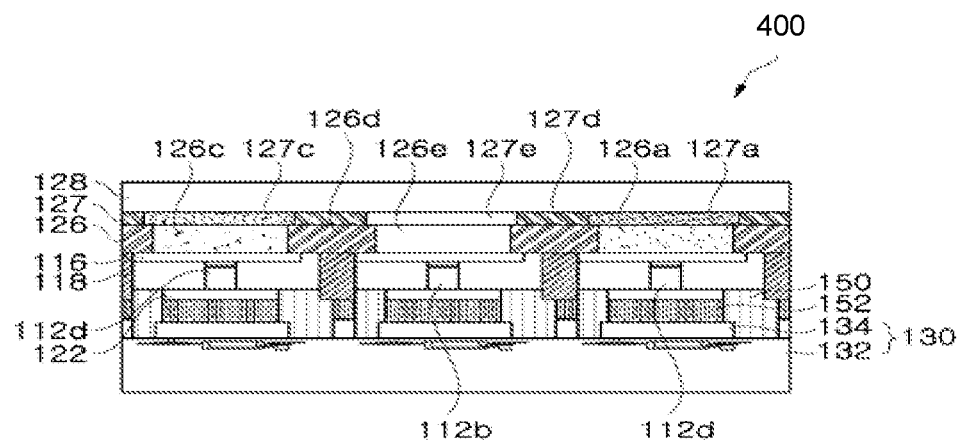
FIG. 6 is a cross-sectional view of a pixel of a display apparatus according to a fourth exemplary embodiment.

FIG. 6 is a cross-sectional view of a pixel of a display apparatus according to a fourth exemplary embodiment of the present disclosure.

Referring to FIG. 6, the display apparatus 400 according to the fourth exemplary embodiment includes a light emitting diode part 110, a TFT panel part 130, and an anisotropic conductive film 150. The light emitting diode part 110 includes a light emitting part 111 and a light conversion part 123. The display apparatus 400 according to the fourth exemplary embodiment may include components substantially similar to those of the display apparatus 100 according to the first exemplary embodiment shown in FIGS. 1 and 2, and thus, repeated description thereof will be omitted.

The light emitting part 111 includes green light emitting diodes 112b, UV light emitting diodes 112d, transparent electrodes 116, blocking portion s 118, and first connection electrodes 122. The light conversion part 123 includes a phosphor layer 126, a color filter 127, and a protective substrate 128.

Unlike the first exemplary embodiment, the display apparatus 400 according to the fourth exemplary embodiment includes the UV light emitting diodes 112d instead of the blue light emitting diodes 112a. Thus, the UV light emitting diodes 112d are disposed in two subpixels, respectively, and the green light emitting diode 112b is disposed in one subpixel.

The phosphor layer 126 includes a blue phosphor layer 126a, a red phosphor layer 126c, and a transparent layer 126e. The phosphor layer 126 further includes a blocking layer 126d disposed between the blue phosphor layer 126a and the red phosphor layer 126c, and between the red phosphor layer 126c and the transparent layer 126e.

As in the first exemplary embodiment, the red phosphor layer 126c is disposed at a location corresponding to the first subpixel SP1 and emits red light through wavelength conversion of UV light emitted from the UV light emitting diode 112d. The blue phosphor layer 126a is disposed at a location corresponding to the third subpixel SP3 and emits blue light through wavelength conversion of UV light emitted from the UV light emitting diode 112d.

In addition, the color filter 127 includes a blue light portion 127a, a red light portion 127c, and a transparent portion 127e. The color filter 127 further includes a light blocking portion 127d, which is disposed between the blue light portion 127a and the red light portion 127c, and between the red light portion 127c and the transparent portion 127e.

As in the first exemplary embodiment, the red light portion 127c is disposed at a location corresponding to the first subpixel SP1 and allows light emitted from the red phosphor layer 126c to pass therethrough such that only the red light can be discharged to the outside therethrough. The blue light portion 127a is disposed at a location corresponding to the third subpixel SP3 and allows light emitted from the blue phosphor layer 126a to pass therethrough, such that only the blue light can be discharged to the outside therethrough.

In this exemplary embodiment, the blue light portion 127a allows only blue light to pass therethrough by blocking light of other wavelengths other than the blue light.

Figure 7:
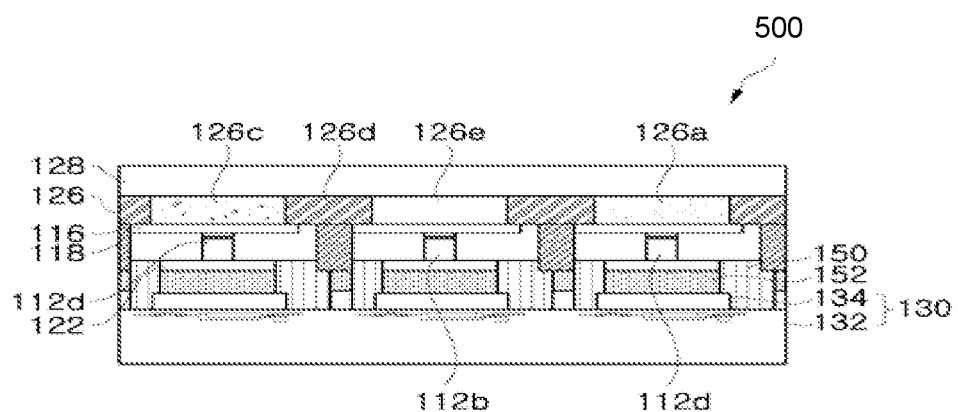
FIG. 7 is a cross-sectional view of a pixel of a display apparatus according to a fifth exemplary embodiment.

FIG. 7 is a cross-sectional view of a pixel of a display apparatus according to a fifth exemplary embodiment.

Referring to FIG. 7, the display apparatus 500 according to the fifth exemplary embodiment includes a light emitting diode part 110, a TFT panel part 130, and an anisotropic conductive film 150. The light emitting diode part 110 includes a light emitting part 111 and a light conversion part 123. The display apparatus 500 according to the fifth exemplary embodiment may include components substantially similar to those of the display apparatus 100 according to the first exemplary embodiment shown in FIGS. 1 and 2, and thus, repeated description thereof will be omitted.

The light emitting part 111 includes green light emitting diodes 112b, UV light emitting diodes 112d, transparent electrodes 116, blocking portions 118, and first connection electrodes 122. The light conversion part 123 includes a phosphor layer 126 and a protective substrate 128.

Unlike the fourth exemplary embodiment, in the display apparatus 500 according to the fifth exemplary embodiment, the light conversion part 123 does not include the color filter 127. Accordingly, UV light emitted from one of two UV light emitting diodes 112d in the light emitting part 111 is converted into red light through wavelength conversion of a red phosphor layer 126c of the phosphor layer 126, whereby the red light may be discharged to the outside through the protective substrate 128. In addition, UV light emitted from the other UV light emitting diode 112d is converted into blue light through wavelength conversion of a blue phosphor layer 126a of the phosphor layer 126, whereby the blue light may be discharged to the outside through the protective substrate 128.

More particularly, as in the fourth exemplary embodiment, the phosphor layer 126 according to this exemplary embodiment includes the blue phosphor layer 126a, the red phosphor layer 126c, and the transparent layer 126e. As such, in this exemplary embodiment, when the light conversion part 123 includes the phosphor layer 126 and the protective substrate 128, the light conversion part 123 may be formed to have a smaller thickness than that in the fourth exemplary embodiment.

Figure 8:
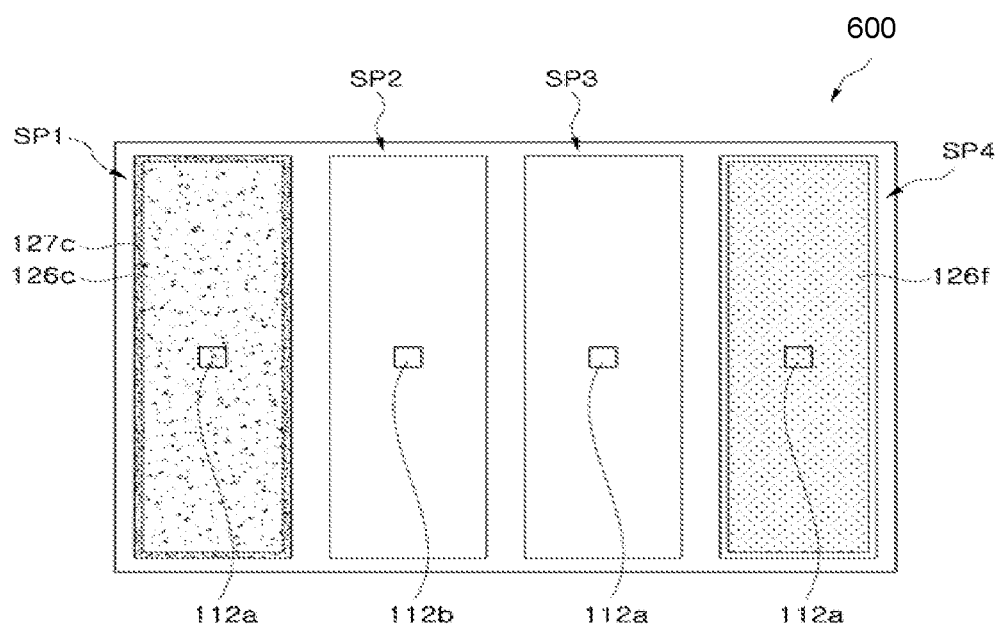
FIG. 8 is a plan view of a pixel of a display apparatus according to a sixth exemplary embodiment.
Figure 9:
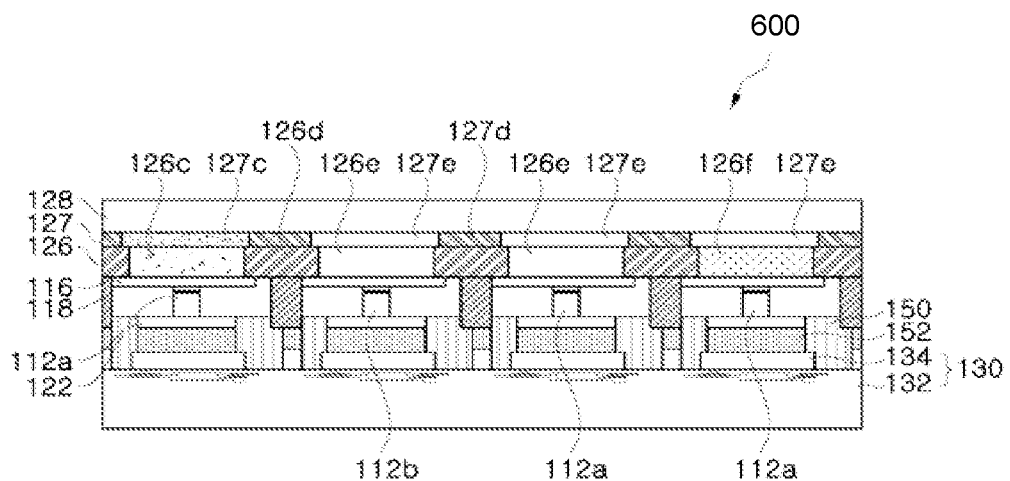
FIG. 9 is a cross-sectional view of the pixel of the display apparatus according to the sixth exemplary embodiment.

FIG. 8 is a plan view of a pixel of a display apparatus according to a sixth exemplary embodiment. FIG. 9 is a cross-sectional view of the pixel of the display apparatus according to the sixth exemplary embodiment.

Referring to FIG. 8 and FIG. 9, the display apparatus 600 according to the sixth exemplary embodiment includes a light emitting diode part 110, a TFT panel part 130, and an anisotropic conductive film 150. The light emitting diode part 110 includes a light emitting part 111 and a light conversion part 123. The display apparatus 600 according to the sixth exemplary embodiment may include components substantially similar to those of the display apparatus 100 according to the first exemplary embodiment shown in FIGS. 1 and 2, and thus, repeated description thereof will be omitted.

In this exemplary embodiment, one pixel includes four subpixels SP1, SP2, SP3, and SP4. Among the four subpixels SP1, SP2, SP3, and SP4, blue light emitting diodes 112a may be disposed in the first, third, and fourth subpixels SP1, SP3, and SP4, respectively, and a green light emitting diode 112b may be disposed in a second subpixel SP2.

In this exemplary embodiment, each of the subpixels SP1, SP2, SP3, and SP4 may have a larger size than the light emitting diode 112a or 112b disposed in the corresponding subpixel SP1, SP2, SP3 or SP4. The subpixels SP1, SP2, SP3, SP4 may have the same size from each other.

In this exemplary embodiment, the structure of the light emitting part 111 corresponding to one subpixel may be the same as that of the first exemplary embodiment. In addition, one subpixel may have the same size as that of the first exemplary embodiment or may have a smaller size than that of the first exemplary embodiment, as needed.

The light conversion part 123 includes a phosphor layer 126, a color filter 127, and a protective substrate 128.

The phosphor layer 126 includes a red phosphor layer 126c, a transparent layer 126e, and a white phosphor layer 126f, and may further include a blocking layer 126d disposed between the red phosphor layer 126c and the transparent layer 126e, and between the transparent layer 126e and the white phosphor layer 126f.

The red phosphor layer 126c is disposed in the first subpixel SP1, in which the blue light emitting diode 112a is disposed. The transparent layer 126e is disposed in each of the second and third subpixels SP2 and SP3, in which the green light emitting diode and the blue light emitting diode 112a are disposed, respectively, and the white phosphor layer 126f is disposed in the fourth subpixel SP4, in which the blue light emitting diode 112a is disposed.

The white phosphor layer 126f may emit white light through wavelength conversion of blue light emitted from the blue light emitting diode 112a disposed in the fourth subpixel SP4.

The color filter 127 may include a red light portion 127c, a light blocking portion 127d, and a transparent portion 127e. In this exemplary embodiment, the color filter 127 includes one red light portion 127c and three transparent portions 127e, and the light blocking portion 127d may be disposed between the red light portion 127c and the transparent portion 127e.

The red light portion 127c is disposed in the first subpixel SP1 and blocks light having passed through the red phosphor layer 126c other than the red light. The three transparent portions 127e are disposed in the second to fourth subpixels SP2, SP3, and SP4, respectively. With this structure, green light emitted from the green light emitting diode 112b disposed in the second subpixel SP2 may be discharged to the outside through the transparent portion 127e, and blue light emitted from the blue light emitting diode 112a disposed in the third subpixel SP3 may be discharged to the outside through the transparent portion 127e. In addition, white light emitted from the white phosphor layer 126f in the fourth subpixel SP4 may be discharged to the outside through the transparent portion 127e.

As such, the four subpixels SP1, SP2, SP3, and SP4 may form one pixel, whereby blue light, green light, red light, and white light may be discharged to the outside.

Figure 10:
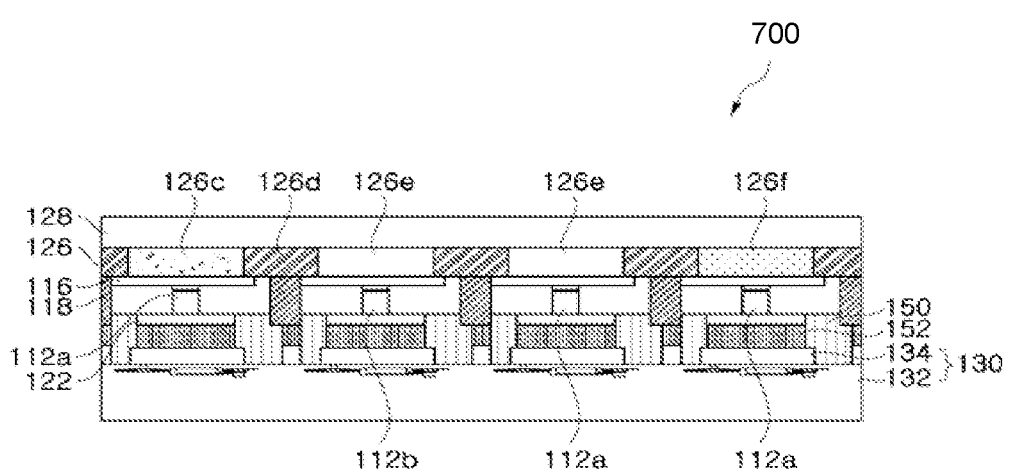
FIG. 10 is a cross-sectional view of a pixel of a display apparatus according to a seventh exemplary embodiment.

FIG. 10 is a plan view of a pixel of a display apparatus according to a seventh exemplary embodiment.

Referring to FIG. 10, the display apparatus 700 according to the seventh exemplary embodiment includes a light emitting diode part 110, a TFT panel part 130, and an anisotropic conductive film 150. The light emitting diode part 110 includes a light emitting part 111 and a light conversion part 123. The display apparatus 700 according to the seventh exemplary embodiment may include components substantially similar to those of the display apparatus 100 to 600 according to the first to sixth exemplary embodiments, and thus, repeated description thereof will be omitted.

The light emitting part 111 includes blue light emitting diodes 112a, green light emitting diodes 112b, transparent electrodes 116, blocking portions 118, and first connection electrodes 122. The light conversion part 123 includes a phosphor layer 126 and a protective substrate 128.

Unlike the sixth exemplary embodiment, in the display apparatus 700 according to the seventh exemplary embodiment, the light conversion part 123 does not include the color filter 127. Accordingly, blue light emitted from one of three blue light emitting diodes 112a in the light emitting part 111 is subjected to wavelength conversion while passing through a red phosphor layer 126c, and blue light emitted from another blue light emitting diode is subjected to wavelength conversion while passing through the white phosphor layer 126f. More particularly, blue light emitted from the blue light emitting diode 112a disposed in the first subpixel SP1 is converted into red light through wavelength conversion of the red phosphor layer 126c, whereby the red light is discharged to the outside through the protective substrate 128, and blue light emitted from the blue light emitting diode 112a disposed in the fourth subpixel SP4 is converted into white light through wavelength conversion of the white phosphor layer 126f, whereby the white light is discharged to the outside through the protective substrate 128.

In addition, green light and blue light emitted from the green light emitting diode 112b, and the blue light emitting diode 112a disposed in the second and third subpixels SP2 and SP3, respectively, may be discharged to the outside through the transparent layer 126e and the protective substrate 128 without wavelength conversion.

As such, in this exemplary embodiment, the light conversion part 123 includes the phosphor layer 126 and the protective substrate 128, and thus, may have a smaller thickness than the light conversion part 123 according to the sixth exemplary embodiment.

In addition, although the light emitting part 111 includes the blue light emitting diodes 112a and the green light emitting diodes 112b in the sixth and seventh exemplary embodiments, the light emitting part 111 may further include UV light emitting diodes 112d, as needed. The UV light emitting diode 112d may be disposed in each of the first subpixel SP1, in which the red phosphor layer 126c is disposed, and the fourth subpixel SP4, in which the white phosphor layer 126f is disposed. With this structure, UV light emitted from the UV light emitting diode 112d disposed in the first subpixel SP1 is converted into red light through wavelength conversion of the red phosphor layer 126c, whereby the red light may be discharged to the outside, and UV light emitted from the UV light emitting diode 112*d* disposed in the fourth subpixel SP4 is converted into white light through wavelength conversion of the white phosphor layer 126*f*, whereby the white light may be discharged to the outside.

As in the sixth and seventh exemplary embodiments, the second and third subpixels SP2 and SP3 are provided with the green light emitting diode 112*b* and the blue light emitting diode 112*a*, respectively.

Figure 11:
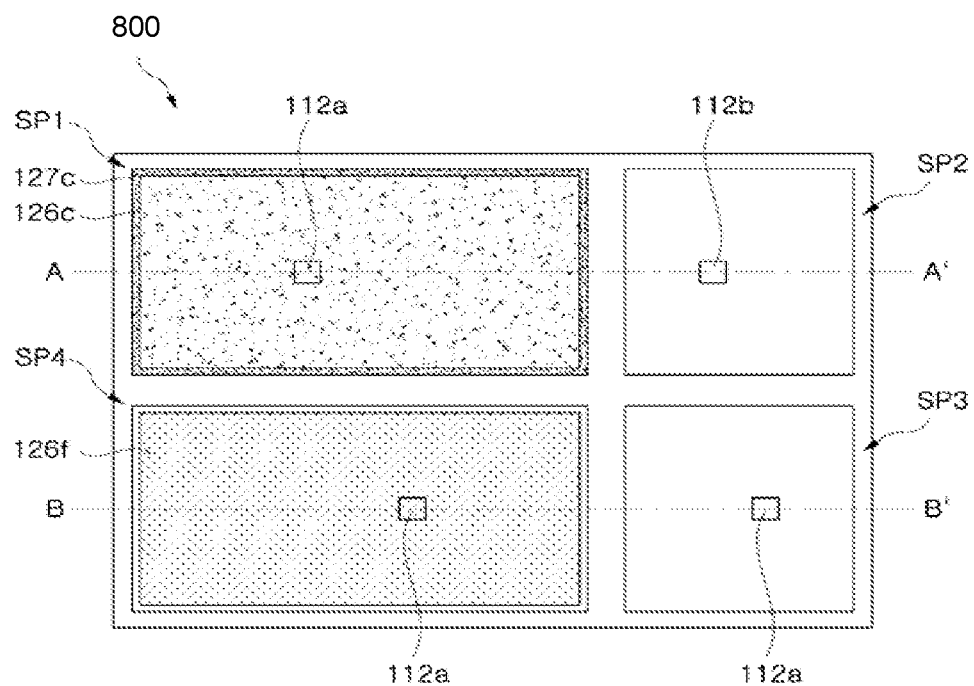
FIG. 11 is a plan view of a pixel of a display apparatus according to an eighth exemplary embodiment.
Figure 12A:
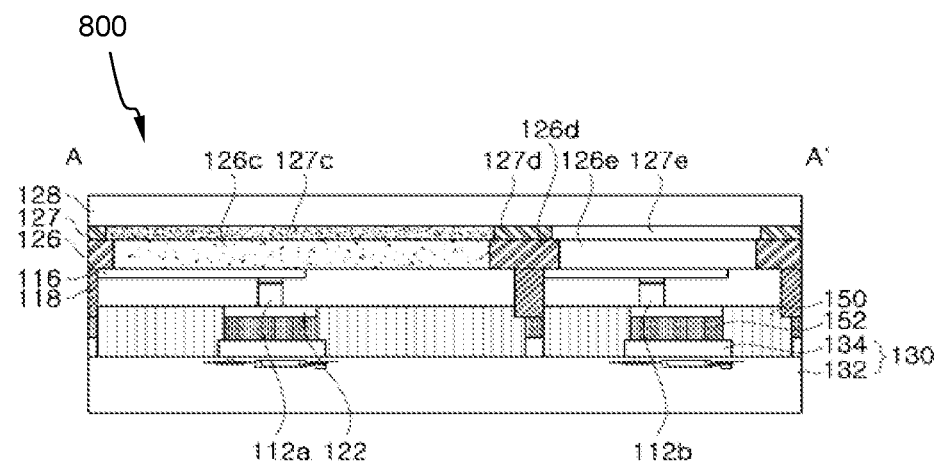
FIG. 12A and FIG. 12B are cross-sectional views taken along line A-A' and line B-B' of FIG. 11, respectively.

FIG. 11 is a plan view of a pixel of a display apparatus according to an eighth exemplary embodiment. FIG. 12A is a cross-sectional view taken along line A-A' of FIG. 11, and FIG. 12B is a cross-sectional view taken along line B-B' of FIG. 11.

Figure 12B:
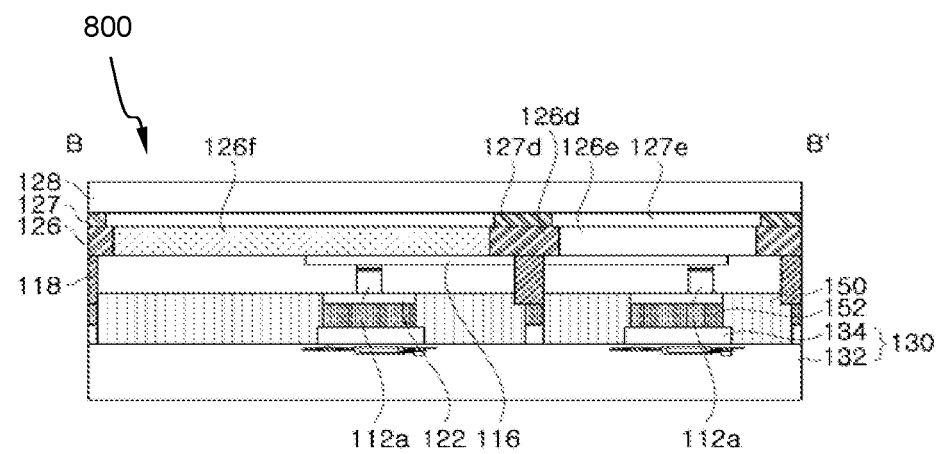

Referring to FIG. 11, FIG. 12A, and FIG. 12B, the display apparatus 800 according to the eighth exemplary embodiment includes a light emitting diode part 110, a TFT panel part 130, and an anisotropic conductive film 150. The light emitting diode part 110 includes a light emitting part 111 and a light conversion part 123. The display apparatus 800 according to the eighth exemplary embodiment may include components substantially similar to those of the display apparatus 100 to 600 according to the first to sixth exemplary embodiments, and thus, repeated description thereof will be omitted.

Referring to FIG. 11, in this exemplary embodiment, one pixel includes four subpixels SP1, SP2, SP3, and SP4. Among the four subpixels SP1, SP2, SP3, and SP4, blue light emitting diodes 112*a* may be disposed in first, third, and fourth subpixels SP1, SP3, and SP4, respectively, and a green light emitting diode 112*b* may be disposed in a second subpixel SP2.

Among the four subpixels SP1, SP2, SP3, and SP4, the first and fourth subpixels SP1 and SP4 may have a larger size than the second and third subpixels SP2 and SP3. The first and fourth subpixels SP1 and SP4 may have the same area from each other, and the second and third subpixels SP2 and SP3 may have the same area from each other. Although FIG. 11 shows that the first and fourth subpixels SP1 and SP4 have an area about two times greater than that of the second and third subpixels SP2 and SP3, the inventive concept is not limited thereto, and the size of the subpixels may be modified in various ways.

In this exemplary embodiment, blue light emitting diodes 112*a* are disposed in the first, third, and fourth subpixels SP1, SP3, and SP4, respectively, and a green light emitting diode 112*b* is disposed in the second subpixel SP2.

As in the sixth exemplary embodiment, the light conversion part 123 includes a phosphor layer 126, a color filter 127, and a protective substrate 128. The phosphor layer 126 includes a red phosphor layer 126*c*, a blocking layer 126*d*, a transparent layer 126*e*, and a white phosphor layer 126*f*. The color filter 127 includes a red light portion 127*c*, a blocking portion 118, and a transparent portion 127*e*. The red phosphor layer 126*c* is disposed in the first subpixel SP1 and the white phosphor layer 126*f* is disposed in the fourth subpixel SP4. In addition, the transparent layer 126*e* is disposed in each of the second and third subpixels SP2 and SP3. Here, each of the red phosphor layer 126*c*, the transparent layer 126*e*, and the white phosphor layer 126*f* has a larger size than the corresponding subpixel. Thus, each of the red phosphor layer 126*c* and the white phosphor layer 126*f* may have a larger size than the transparent layer 126*e*.

In the color filter 127, the red light portion 127*c* is disposed in the first subpixel SP1 and the transparent portion 127*e* is disposed in each of the second to fourth subpixels SP2, SP3, and SP4. In this exemplary embodiment, the red light portion 127*c* disposed in the first subpixel SP1 and the transparent portion 127*e* disposed in the fourth subpixel SP4 may have a larger size than the transparent portions 127*e* disposed in the second and third subpixels SP2 and SP3.

As such, the first and fourth subpixels SP1 and SP4 have a larger size than the second and third subpixels SP2 and SP3, since the red phosphor layer 126*c* and the white phosphor layer 126*f* are disposed in the first and fourth subpixels SP1 and SP4, respectively.

The second and third subpixels SP2 and SP3 allow green light and blue light emitted from the green light emitting diode 112*b* and the blue light emitting diode 112*a* disposed therein to be discharged to the outside without wavelength conversion. On the other hand, in the first and fourth subpixels SP1 and SP4, blue light emitted from the blue light emitting diodes 112*a* disposed therein is subjected to wavelength conversion in the red phosphor layer 126*c* and the white phosphor layer 126*f*. As a result, the intensity of light emitted through the red phosphor layer 126*c* and the white phosphor layer 126*f* may be reduced.

According to this exemplary embodiment, since the first and fourth subpixels SP1 and SP4, in which the red phosphor layer 126*c* and the white phosphor layer 126*f* are disposed, have a larger size than the second and third subpixels SP2 and SP3, light emitted from the subpixels may have the same intensity.

Here, the sizes of the first to fourth subpixels SP1, SP2, SP3, and SP4 may be changed such that light emitted from the subpixels SP1, SP2, SP3, and SP4 may have the same intensity.

According to exemplary embodiments, the display apparatus employs micro-light emitting diodes formed of nitride semiconductors to realize high resolution, low power consumption and high efficiency. Accordingly, the display apparatus can be applied to various apparatuses including a wearable apparatus.

In addition, the display apparatus is manufactured using blue light emitting diodes and green light emitting diodes, thereby improving efficiency while reducing manufacturing costs.

Further, in the display apparatus according to exemplary embodiments, a subpixel emitting red light has a larger area than subpixels emitting blue light and green light. Thus, the display apparatus increases intensity of red light emitted through phosphors such that blue light, green light and red light emitted from one pixel can have uniform intensity.

Although some exemplary embodiments have been described herein, it should be understood by those skilled in the art that these embodiments are given by way of illustration only, and that various modifications, variations, and alterations can be made without departing from the spirit and scope of the invention. Therefore, the scope of the present disclosure should be limited only by the accompanying claims and equivalents thereof.

What is claimed is:
1. A display device comprising:
a panel substrate including a circuit; and
a light module disposed on the panel substrate and comprising a plurality of light sources, each of the light sources comprising:
a light emitter configured to emit a primary light;
a connection line configured to electrically connect the light emitter and the circuit of the panel substrate;
a light transmission layer disposed on the light emitter and covering a side of the light emitter; and
a light block layer disposed on the light transmission layer, wherein the plurality of the light sources comprises a first light source, a second light source, a third light source, and a fourth light source, wherein a transmission layer of the first light source comprises a first converter disposed on a light emitter of the first light source, and a transmission layer of the fourth light source comprises a second converter disposed on a light emitter of the fourth light source, wherein the first converter includes a wavelength converter configured to convert a first primary light emitted from the light emitter of the first light source into a red color range, wherein the second converter is configured to convert a fourth primary light emitted from the light emitter of the fourth light source into a white light, and wherein a peak wavelength of a second primary light emitted from the second light source is different from a peak wavelength of a third primary light emitted from the third light source.

2. The display device of claim 1, further comprising a color filter disposed on the light module and configured to block light having passed through the color filter except light having a desired wavelength.

3. The display device of claim 1, wherein the circuit is configured to control an intensity of light emitted from the plurality of the light sources.

4. The display device of claim 1, wherein the wavelength converter is dispersed in the light transmission layer of the first light source.

5. The display device of claim 1, wherein the second converter is dispersed in the light transmission layer of the fourth light source.

6. The display device of claim 1, wherein the first primary light is in a blue color range.

7. The display device of claim 1, wherein a light transmission layer of the second light source comprises a light transparent region.

8. A display device comprising:
a panel substrate including a circuit; and
a light module disposed on the panel substrate and comprising a plurality of light sources, each of the light sources comprising:
a light emitter configured to emit a primary light;
a connection line configured to electrically connect the light emitter and the circuit of the panel substrate;
a light transmission layer disposed on the light emitter and covering a side of the light emitter; and
a light block layer disposed on the light transmission layer,
wherein the plurality of the light sources comprises a first light source, a second light source, a third light source, and a fourth light source,
wherein a transmission layer of the first light source comprises a first converter disposed on a light emitter of the first light source and a transmission layer of the fourth light source comprises a second converter disposed on a light emitter of the fourth light source,
wherein the first converter includes a wavelength converter configured to convert a first primary light emitted from the light emitter of the first light source into a red color range,
wherein the second converter is configured to convert a fourth primary light emitted from the light emitter of the fourth light source into a white light, and
wherein a peak wavelength of a second primary light emitted from the second light source is different from that of the first primary light emitted from the first light source, and a third primary light of the third light source is in the same color range as a fourth primary light of the fourth light source.

9. The display device of claim 8, further comprising a color filter disposed on the light module and configured to block light having passed through the color filter except light of a desired wavelength.

10. The display device of claim 8, wherein the circuit is configured to control an intensity of light emitted from the plurality of the light sources.

11. The display device of claim 8, wherein the wavelength converter is dispersed in the light transmission layer of the first light source.

12. The display device of claim 8, wherein the second converter is dispersed in the light transmission layer of the fourth light source.

13. The display device of claim 8, wherein the first primary light is in a blue color range.

14. The display device of claim 8, wherein a light transmission layer of the second light source comprises a light transparent region.

15. A display device comprising:
a panel substrate including a circuit; and
a light module disposed on the panel substrate and comprising a plurality of light sources, each of the light sources comprising:
a light emitter configured to emit a primary light;
a connection line configured to electrically connect the light emitter and the circuit of the panel substrate;
a light transmission layer disposed on the light emitter and covering a side of the light emitter; and
a light block layer disposed on the light transmission layer,
wherein the plurality of the light sources comprises a first light source, a second light source, a third light source, and a fourth light source,
wherein a transmission layer of the first light source comprises a first converter disposed on a light emitter of the first light source and a transmission layer of the fourth light source comprises a second converter disposed on a light emitter of the fourth light source,
wherein the first converter includes a wavelength converter configured to convert a first primary light emitted from the light emitter of the first light source into a red color range,
wherein the second converter is configured to convert a fourth primary light emitted from the light emitter of the fourth light source into a white light, and
wherein a third primary light of the third light source is in the same color range as a fourth primary light of the fourth light source.

16. The display device of claim 15, further comprising a color filter disposed on the light module and configured to block light having passed through the color filter except light of a desired wavelength.

17. The display device of claim 15, wherein the circuit is configured to control an intensity of light emitted from the plurality of the light sources.

18. The display device of claim 15, wherein the wavelength converter is dispersed in the light transmission layer of the first light source.

19. The display device of claim 15, wherein the second converter is dispersed in the light transmission layer of the fourth light source.

20. The display device of claim 15, wherein a light transmission layer of the second light source comprises a light transparent region.

* * * * *